United States Patent [19]

Schroder et al.

[11] Patent Number: 4,905,319

[45] Date of Patent: Feb. 27, 1990

[54] SUPERCONDUCTING DEVICE INCLUDING A THIN CHROMIUM FILM WITH NEGATIVE SUSCEPTIBILITY

[75] Inventors: Klaus Schroder, East Syracuse; Hussin Hejase, Syracuse, both of N.Y.

[73] Assignee: Syracuse University, Syracuse, N.Y.

[21] Appl. No.: 78,758

[22] Filed: Jul. 28, 1987

[51] Int. Cl.[4] ...................... H01L 23/48; H01L 29/40
[52] U.S. Cl. ....................................... 357/65; 505/803; 505/805; 505/862; 174/125.1
[58] Field of Search ....................... 357/5, 65; 365/161; 427/62; 129/599; 428/666; 505/803, 804, 805, 862

[56]         References Cited
         U.S. PATENT DOCUMENTS 4,178,602  12/1979  Kandyba et al. .................... 357/5 X
4,458,409   7/1984  Latta et al. .......................... 357/5 X
4,715,930  12/1987  Diem .................................. 357/65 X

OTHER PUBLICATIONS

Wert, C., et al., *Physics of Solids*, McGraw Hill, 1970, pp. 431–436.

*Primary Examiner*—Andrew J. James
*Assistant Examiner*—Sara W. Crane
*Attorney, Agent, or Firm*—Wall and Roehrig

[57]                ABSTRACT

A room temperature superconductor having a metal thin film with negative susceptibility coated upon a substrate. The thin film is covered by a protective coating which prevents it from oxidizing. In one embodiment of the invention multiple layers of chromium with negative susceptibility value separated by a protective coating are mounted upon the substrate to provide a sandwich like structure having increased current carrying capacity.

26 Claims, 2 Drawing Sheets

SUPERCONDUCTING DEVICE INCLUDING A THIN CHROMIUM FILM WITH NEGATIVE SUSCEPTIBILITY

BACKGROUND OF THE INVENTION

This invention relates to a superconductor and in particular, to a device that is superconductive at room temperature.

More specifically, this invention deals with the unimpeded flow of electrically or magnetically induced currents through solid materials. Typically, when current flows through a solid a heat effect is produced and, as a consequence, additional energy must be provided to the system to keep the current flowing. A penalty which sometimes is relatively heavy must be paid in order to conduct electrical energy over any appreciable distance.

The only class of materials which does not require constant addition of energy to keep current moving is a group of conductors known as superconductors. Superconductivity is not only associated with the friction free flow of electrons or of electron pairs within a material but also with the magnetic effect upon the material. All superconductors exhibit extremely high negative susceptibilities, and magnetically induced currents are established at the material surface which prevent outside magnetic fields from penetrating noticeably into the interior of the material.

Superconductors can be used in many practical applications. Some of the best known applications involve superconducting magnets and magnetic shields. Superconductors are also used in special electronic devices such as the Josephson junction in which both superconducting and non-superconducting materials are combined for use in many computer related applications.

Heretofore, known materials capable of functioning as superconductors could only operate at relatively low temperatures near absolute zero. Recently superconductive materials containing copper oxides and rare earth elements have been developed that can perform at liquid nitrogen temperatures. Although these higher temperature conductors represent a great step forward in the art, none of them are capable of functioning at or near room temperature and, as a consequence special equipment is required to maintain devices embodying these materials at constantly low operating temperatures.

SUMMARY OF THE INVENTION

It is therefore an object of the present invention to improve superconductors.

A further object of the present invention is to provide a superconducting device that is capable of operating at or near room temperatures.

Another object of the present invention is to provide a superconducting device that is manufactured from chromium or chromium alloys.

Yet another object of the present invention is to provide special geometries that will convert a non superconducting material into a superconductor.

These and other objects of the present invention are attained by a superconducting device capable of operating at or near room temperatures which includes a substrate, a thin metallic film having a negative susceptibility mounted upon the substrate and a protective coating covering the thin film for preventing it from oxidizing or otherwise becoming contaminated. In one form of the invention multiple layers of chromium or a chromium alloy thin film having a negative susceptibility and a protective coating are placed one over the other upon a substrate to form a sandwich like structure having an increased current carrying capability.

BRIEF DESCRIPTION OF THE DRAWINGS

For a better understanding of these and other objects of the present invention, reference is made to the following detailed description of the invention which is to be read in conjunction with the accompanying drawing wherein.

DESCRIPTION OF THE INVENTION

Figure 1:
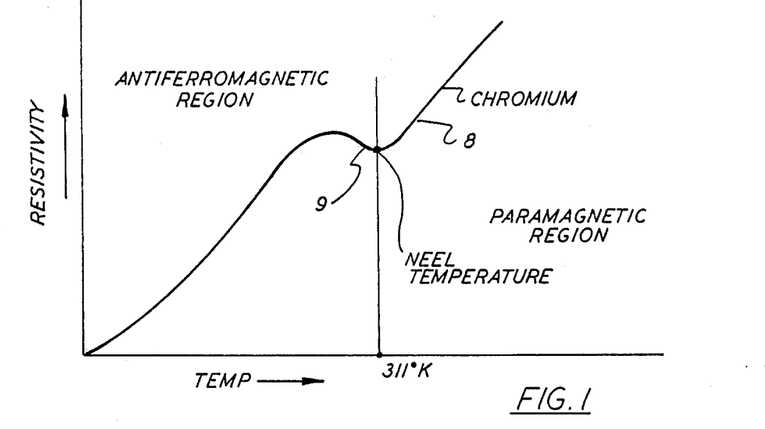
FIG. 1 is a graphic representation relating the resistivity of bulk state chromium to temperature.

Chromium in its bulk state is antiferromagnetic at temperatures below the Neel temperature (311 K.). At higher temperatures the material is paramagnetic. FIG. 1 shows a resistivity curve 8 for bulk chromium wherein resistivity is plotted against temperature. As illustrated, the resistivity of the bulk material shows a pronounced dip or "resistivity minimum" 9 centered about the Neel temperature. All bulk chromium rich alloys display similar resistivity minimums, however, the Neel temperature is displaced to either side of that of the pure chromium depending upon the properties of the alloying material.

Recent theoretical studies have shown that chromium might have a ferromagnetic surface phase with a large magnetic moment. L. E. Klebanoff, S. W. Robey, G. Liu and D. A. Shirley, *Physical Review B,* Vol. 30(2) pgs 1048–1051 (1984). Surface studies by the same authors using angle resolved photoelectron spectroscopy support this theory.

Later it was found that a chromium film deposed on an iron film produced a decrease in the magnetic moment at the interface between the two films. Experiments were conducted in a high vacuum torque magnetometer wherein films were vacuum deposited upon glass plates having a sodium chloride (NaCl) overlayer. K. Schroder and S. Barua, *Journal of Magnetism and Magnetic Materials,* Vol. 54–7 pg. 807–808 (1986). The plates were suspended in the magnetic field region of the magnetometer upon a thin tungsten wire and the period of oscillation of both the filmed and unfilmed plates measured. By measuring the period of oscillation of the filmed and unfilmed plates, the magnetic dipole moment at the interface was determined with high accuracy. Changes in moment equivalent to 0.05 Bohr magnetrons per surface atom were determined at room temperatures. It was suggested from these experiments that a chromium thin film surface is magnetically ordered with the magnetic lines of force being lined up antiparallel to the moment in the iron surfaces. These findings are in agreement with calculation made by Fu and Freeman. C. L. Fu and A. J. Freeman, *Journal of Magnetism and Magnetic Materials*, Vol 54-57, pgs 777-778 (1986).

The high vacuum torque magnetometer noted above was used to measure the dipole moment associated with chromium thin film having thicknesses of between 1 nm and 40 nm to determine if these films exhibited ferromagnetic moments. The films were vacuum deposited upon non-ferromagnetic substrates. Formation of ferromagnetic surface phases in these thin chromium films were easily detected by the experimental set up, however, no evidence of any increase in the dipole moment of the thin films was noted. The torque magnometer system was modified by replacing the glass plate with a thin mica strip typically 0.01 mm thick which was suspended from a tungsten wire having a diameter of 0.01 mm to increase the sensitivity of the system. Measurements made using the modified system showed that the deposition of a thin film of chromium upon a mica sheet, or a mica sheet with a NaCl overlayer, produced a small albeit measurable increase in the sheet's period of oscillation $\tau$. This increase in the period of oscillation corresponds to a decrease in the magnetic moment of the system and provided a clear indication that a thin chromium film is very strongly diamagnetic.

The indication that a thin chromium film, that is, a film having a thickness less than $4 \times 10^2$ Angstroms, is diamagnetic at room temperatures was unpredictable and unexpectable. Experiments carried out by others showed that superconductivity in chromium disappeared at temperatures above 1.5 K. P. M. Schmidt, P. N. Castellano, H. Barz, A. S. Cooper and E. G. Spenser, Journal of Applied Physics 44 pgs. 1833-1836 (1973). Bulk state chromium having a geometry thicker than $10^4$ Angstroms is either antiferromagnetic or paramagnetic depending upon the bulk state material temperature. (See FIG. 1) The magnetic dipole moment of a typical paramagnetic or diamagnetic thin film is so small that the dipole moment should not be expected to produce a measurable change in the period of oscillation of a thin coated mica sheet having a thickness of about 0.01 mm, a slight decrease in the period of oscillation is possible for an antiferromagnetic thin film of this nature. Any change in the period of oscillation of the system produced by an increase in the system mass due to the thin film coating could not be detected by the noted system. The detection of a measurable increase in the period of oscillation produced by the thin chromium film can only be associated with an exceptional large diamagnetic dipole moment in the film.

Figure 2:
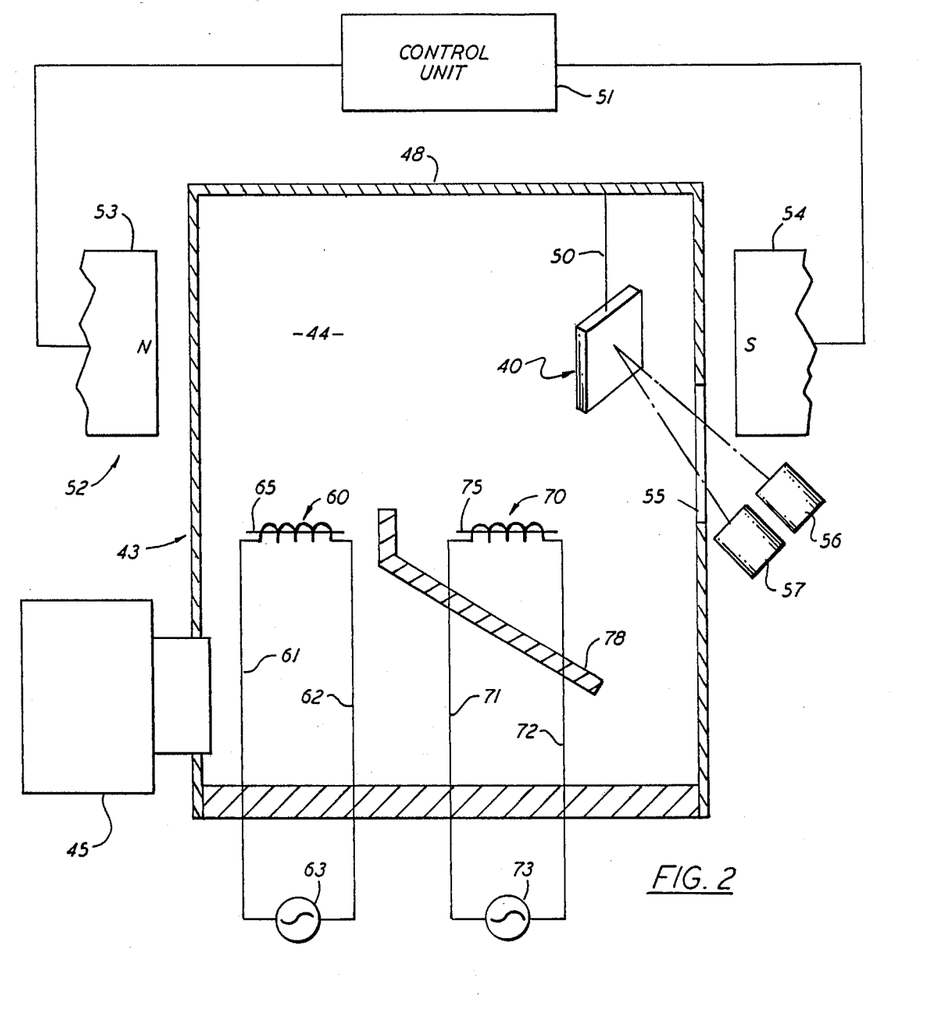
FIG. 2 is a schematic view of a vacuum deposition chamber that is adapted for manufacturing and testing superconductors in accordance with the teachings of the present invention.

A vacuum chamber as depicted in FIG. 2 was constructed to both manufacture and test thin film samples of chromium and chromium alloys having a resistivity minimum at some Neel temperature at or about room temperature. The apparatus includes an evaporation chamber 41 of known construction having a base 42 and a stainless steel housing 43 joined to the base to provide a sealed vacuum chamber 44. The equipment is coupled to a pump down system 45 capable of establishing and maintaining a high vacuum within the chamber. A substrate, such as a thin mica sheet 40, is suspended within the chamber upon a thin tungsten wire 50 having a diameter of about 0.01 nm and a length of about 5 cm.

An electromagnet, generally referenced 52, is mounted outside the chamber. The magnet, shown in schematic form, includes a pair of spaced apart pole pieces 53 and 54 that are connected to a controller 51 for varying the strength of a magnetic field (H) that passes through the chamber. The substrate is exposed to the magnetic field established in the chamber. The electromagnet and the suspended substrate form part of a torque magnetometer used to measure the period of oscillation of the coated and uncoated substrates. A laser 56 is positioned adjacent a window 55 mounted in the chamber wall and arranged to direct a beam of light incident upon the surface of the substrate. The impinging light is reflected back through the window to a scale 57 that enables the period of oscillation of the substrate to be detected and measured accurately.

A first tungsten heating coil 60 is mounted upon the base of the vacuum chamber and is connected by leads 61 and 62 to an exterior power supply 63. A second heating coil 70 is similarly mounted in the chamber and is connected to a second power supply 73 by leads 71 and 72. The heaters are shielded from each other by a protective plate 78. In practice, a chromium or chromium alloy sample 65 of known weight is placed in the first heating coil and evaporated. The evaporated chromium based material is deposited isotropically upon the substrate to produce a thin film upon the sheet. A second sample 75 formed of a protective coating material is placed in the second heater and is evaporated and isotropically deposited over the thin film upon the substrate. Preferably the coating material is selected from a transition element or a noble metal that is capable of preventing the film from becoming oxidized or otherwise contaminated when removed from the high vacuum environment. As will be explained below, the chromium thin film geometry is such that the material has a negative susceptibility and operates as a superconductor at room temperature. If the film is permitted to oxidize or becomes contaminated it will lose its superconductivity.

The fabrication and test equipment shown in FIG. 2 was used to measure the dipole moment of thin mica sheets with and without NaCl overlayers. The mica sheets and their tungsten wire holders were found to deviate only a few degrees from some equilibrium position in which the sheet surface is normally parallel with the applied magnetic field. The dipole moment $(\mu)$ of the sheet and holder system is:

$$\mu_{su} = [V_{su} \cdot \chi_{su}] H \tag{1}$$

where:
  $V_{su}$ is the combined volume of the sheet and holder,
  H is the strength of the magnetic field, and
  $\chi_{su}$ is the average susceptibility of the sheet and holder where $\chi_{su} > 0$ The period of oscillation $(\tau)$ of the sheet produced by the magnetic field is thus easily measurable. The torque $(T_1)$ acting on the sheet is equal to $$T_1 = I\omega_1^2 \alpha \tag{2}$$

where:
  I is the moment of inert of the uncoated sheet system
  $\omega_1$ is the angular velocity of the uncoated sheet, and
  $\alpha$ is the angular displacement of the spin axis.

The moment of inertia of the uncoated system differs by less than 0.1% from that of the uncoated system. This change can be neglected and one value for I can be assumed for both the coated and uncoated mica sheet.

The time for 100 periods of oscillation is accurately measured and the angular velocity of the system determined as follows:

$$\omega = 2\pi\tau \quad (3)$$

The period of oscillation of the system changes when the sheet is coated with a thin film of chromium. By measuring the periods of oscillation of an uncoated sheet and then the same sheet after coating, the susceptibility of the thin film can be determined from the equation:

$$X_{cr} = \frac{X_{su} \cdot X_{su}}{V_{cr}} \frac{W_1^2 - W_1^2}{W_1^2 \; W_0^2} \quad (4)$$

where:

$V_{cr}$ is the volume of chromium evaporated onto the mica sheet,

I is the moment of inertia of the coated system, or uncoated system, $W_O$ is the angular velocity of the uncoated system, without a magnetic field, $W_1$ is the angular momentum of the uncoated system in the magnetic field H, $W_2$ is the angular velocity of the chromium coated system in field H.

The invention will now be explained in greater detail with reference to the following examples:

EXAMPLE I

Using the vacuum system shown in FIG. 2, a thin mica sheet having a typical thickness of 0.01 mm was suspended from a tungsten wire of 0.01 mm diameter and a length about 5 cm long was placed in the chamber between the magnetic pole piece whereby the sheet could be exposed to a magnetic force field (H) of varying strengths. A series of tests were conducted in which several sheets were coated with films of chromium of varying film thicknesses. It was assumed that the films were deposited by isotopic evaporation and that the film mass did not effect the moment of inertia of the system. Some of the sample sheets contained a thin overcoating of NaCl. The results of these tests are tabulated below using equation 4 above.

TABLE I

SUSCEPTIBILITY MEASUREMENTS ON Cr. FILMS

| SAMPLE | ISOTROPIC THICKNESS | MAGNETIC FIELD, Oc | FREQUENCY ω, Hz; ω = 29/T | | | | SUSCEPTIBILITY = X | | | |
|---|---|---|---|---|---|---|---|---|---|---|
| | | | ω Mica | cr | ω cr | ω cr | $X_1$ | $X_2$ | $X_3$ | X |
| I | 25 | 0 | 2.3183 | — | — | — | — | — | — | — |
| | | 900 | 2.8739 | 2.85051 | 2.86773 | 2.8698 | $-11.2 \times 10^{-4}$ | $-4.5 \times 10^{-4}$ | $-2.97 \times 10^{-4}$ | $+1.12 \times 10^{-4}$ |
| | | 1300 | 3.1642 | 3.15601 | 3.1583 | 3.1574 | $-4.1 \times 10^{-4}$ | $-2.95 \times 10^{-4}$ | $-3.42 \times 10^{-4}$ | $+3.12 \times 10^{-4}$ |
| | | 2000 | 3.6604 | 3.6589 | 3.6658 | 3.6752 | $-3.5 \times 10^{-4}$ | $-1.21 \times 10^{-4}$ | $+1.93 \times 10^{-4}$ | $+3.61 \times 10^{-4}$ |
| | | 2500 | 4.0492 | 4.0259 | 4.03209 | 4.0432 | $-6.28 \times 10^{-4}$ | $-4.62 \times 10^{-4}$ | $-1.6 \times 10^{-4}$ | $+1.13 \times 10^{-4}$ |
| II | 100 | 0 | 2.2976 | — | — | — | — | — | — | — |
| | | 900 | 2.8830 | 2.8673 | 2.0742 | — | $-2.44 \times 10^{-4}$ | $-1.56 \times 10^{-4}$ | — | — |
| | | 1300 | 3.1541 | 3.1439 | 3.1392 | — | $-1.27 \times 10^{-4}$ | $-1.87 \times 10^{-4}$ | — | — |
| | | 2000 | 3.6204 | 3.6019 | 3.6089 | — | $-1.59 \times 10^{-4}$ | $-0.99 \times 10^{-4}$ | — | — |
| | | 2500 | 2.9639 | 3.9366 | 3.9514 | — | $-1.34 \times 10^{-4}$ | $-0.89 \times 10^{-4}$ | — | — |
| III | 200 | 0 | 3.2471 | — | — | — | — | — | — | — |
| | | 900 | 3.82267 | — | 3.8368 | 3.8375 | — | $+1.2 \times 10^{-4}$ | $+1.26 \times 10^{-4}$ | — |
| | | 1300 | 4.0370 | — | 4.3112 | 4.3291 | — | $-1.21 \times 10^{-4}$ | $-0.98 \times 10^{-4}$ | — |
| | | 2000 | 5.1127 | — | 5.0614 | 4.8955 | — | $-1.51 \times 10^{-4}$ | $-6.26 \times 10^{-4}$ | — |
| | | 2500 | 5.78707 | — | 5.5669 | 5.5499 | — | $-4.89 \times 10^{-4}$ | $-5.3 \times 10^{-4}$ | — |

*1 = Measured after 15 min.
2 = Measured after 1 hour
3 = Measured after 2 hours
4 = Measured after 2 days susceptibility of a superconductor is typically somewhere in the range of between $10^{-5}$ and $-\frac{1}{4}\pi$. The large negative values found for the thin chromium films tested clearly demonstrated that these films are within the range and thus superconductors.

alloyed sample was exposed to different magnetic fields and in each case the measured susceptibility showed that the alloy did not affect the negative susceptibility of the chromium base material.

The results of this second set of tests are tabulated below.

TABLE II

SUSCEPTIBILITY MEASUREMENTS ON Cr & Cr Ec FILMS

| SAMPLE | ISOTROPIC THICKNESS, A° | MAGNETIC FIELD, Oe | FREQUENCY ω (Hz); ω = 2 n/t | | | SUSCEPTIBILITY, X | |
|---|---|---|---|---|---|---|---|
| | | | ω Mica | ω Cr | ω Cr, Fe | X Cr | X Cr, Fe |
| I | | 0 | 1.9740 | — | — | — | — |
| | 100 | 1281 | 2.99262 | 2.9337 | — | $-1.1 \times 10^3$ | — |
| | | 2145 | 3.78208 | 3.6847 | — | $-1.1 \times 10^{-3}$ | — |
| | | 2572 | 4.1347 | 4.0474 | — | $-0.9 \times 10^{-3}$ | — |
| II | 98 Cr | 0 | 1.6891 | — | — | — | — |
| | 02 Fe | 1010 | 2.954983 | — | 2.8253 | — | $-2.2 \times 10^{-3}$ |
| | | 2008 | 3.910613 | — | 3.79236 | — | $-1.1 \times 10^{-3}$ |
| | | 3008 | 4.643205 | — | 4.5782 | — | $-0.5 \times 10^{-3}$ |
| III | 2.8 | 0 | 1.4741 | — | — | — | — |
| | | 2067 | 3.1820 | 3.1613 | — | $-1 \times 10^{-2}$ | — |
| IV | 280 | 0 | 1.9741 | — | — | $-4 \times 10^{-4}$ | — |
| | | 2057 | 3.2744 | 3.1781 | — | — | — |
| V | 73 | — | — | — | — | $< -1.5 \times 10^{-2}$ | — |

*Note: Sample will not line up with field after Cr evaporation which suggests XCr $< -1.5 \times 10^{-2}$

EXAMPLE II

Using the same test set up as described above in reference to Example I, the tests were repeated for a number of samples having chromium films of varying thicknesses ranging 2.8 Angstroms to 280 Angstroms. Here again it was shown that the thin chromium films remained strongly diamagnetic throughout the range. In one case, a sample having an 8 Angstrom thick film became oxidized and it changed rapidly to ferromagnetic state showing the need of protecting the thin film. Sample II was coated using a chromium iron alloy that contained 98% chromium and 2% iron. The thickness of the alloyed thin film was about 90 Angstroms. The

EXAMPLE III

A third set of tests were conducted using the same test set up as noted above to show the effects of a protective overcoating upon samples having either a chromium or a chromium alloy thin film on a mica sheet. Protective overcoatings of both palladium and silver were placed over chromium based thin films having a strong negative susceptibility. It was shown that the protective coatings of these elements prevented the thin film from oxidizing and additionally served to decrease the susceptibility of the thin film thus increasing the samples superconductivity.

TABLE III
SUSCEPTIBILITY MEASUREMENTS ON Ag/CrFe ALLOY and Pd/Cr FILMS

| SAMPLE | ISOTROPIC THICKNESS | MAGNETIC FIELD, Oe | FREQUENCY ωHz; ω = 2π/T | | | | SUSCEPTIBILITY X | | | |
|---|---|---|---|---|---|---|---|---|---|---|
| | | | ωMica | ωCr 2 Hr | ωCr,Fe | ωAg/Cr,Fe | ωPd/Cr | XCr | XCr,Fe | XPd/Cr | XAg/Cr,Fe |
| I | Cr | 0 | 3.2471 | — | — | — | — | — | — | — | — |
| | 200 | 900 | 3.82267 | 3.8375 | — | — | 3.82469 | $+1.26 \times 10^{-4}$ | — | $+0.171 \times 10^{-4}$ | — |
| | | 1300 | 4.3370 | 4.3291 | — | — | 4.3132 | $-0.38 \times 10^{-4}$ | — | $-1.12 \times 10^{-4}$ | — |
| | Pd | 2000 | 5.1127 | 4.8955 | — | — | 5.0829 | $-6.26 \times 10^{-4}$ | — | $-0.87 \times 10^{-4}$ | — |
| | 200 | 2500 | 5.78707 | 5.5499 | — | — | 5.6301 | $-5.3 \times 10^{-4}$ | — | $-3.51 \times 10^{-4}$ | — |
| II | 98% Cr 02% Fe | 0 | 1.6891 | — | — | — | — | — | — | — | — |
| | 95 | 1010 | 2.954983 | — | 2.8253 | 2.5380 | — | — | $-2.2 \times 10^{-3}$ | — | $-5 \times 10^{-3}$ |
| | Ag | 2008 | 3.910613 | — | 3.79236 | 3.5914 | — | — | $-1.1 \times 10^{-3}$ | — | $-3.3 \times 10^{-3}$ |
| | 51 | 3008 | 4.643205 | — | 4.55651 | 4.1429 | — | — | $-0.5 \times 10^{-3}$ | — | $-2 \times 10^{-3}$ |

EXAMPLE IV

It was noted that the torque produced by a magnetic field acting on the tungsten wire 50 (FIG. 2) and a paramagnetic mica sheet 40 in the test set up tends to line the flat sheet surfaces Parallel to the magnetic field lines. The diamagnetic chromium thin films deposited upon the mica sheet, with or without protective coating on the other hand tended to align the flat sheet surfaces perpendicular to the field lines. The diamagnetic moment of the film is generally only strong enough to increase the period of oscillation because the volume of the thin film ($V_{cr}$) is orders of magnitude smaller than the combined volume of the tungsten wire and mica sheet ($V_{Su}$). However, in the case of at least one test sample, the diamagnetic moment of the film was so large, the coated sheet would not line up parallel to the field lines and the sheet turned away from the field lines. This coated sheet was test sample V noted in Table II above. The diamagnetic dipole moment of the thin film was larger than that of the paramagnetic sheet and the tungsten wire whereby:

$$\chi_{cr} > \chi_{su} \cdot V_{su}/V_{cr} \qquad (6)$$

Using the noted relationship, it can be shown that the absolute susceptibility of the sample is $\chi_{cr} > 1.5 \times 10^{-2}$.

Figures 3, 4, 6:
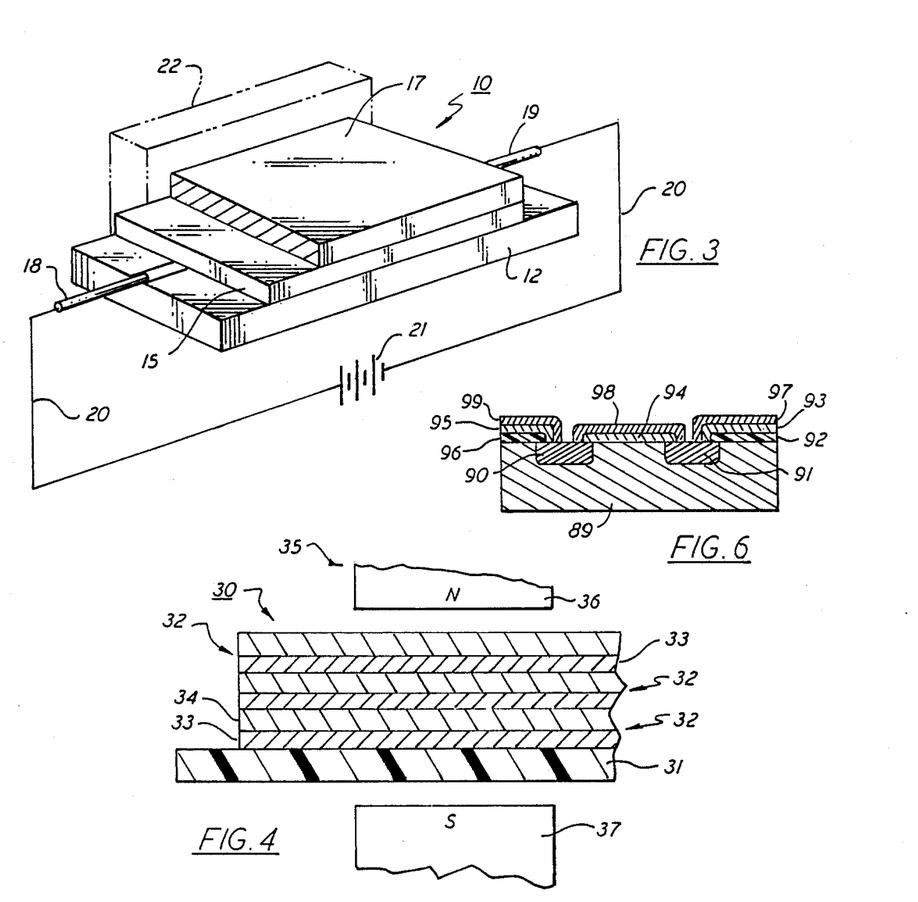
FIG. 3 is an enlarged perspective view of a superconducting device embodying the teachings of the present invention.
FIG. 4 is an enlarged view in section of another embodiment of the invention.
FIG. 6 is still another enlarged view in section of a semiconductor utilizing the teachings of the present invention.

Turning now to FIG. 3 there is illustrated a first embodiment of the invention. A superconductive device, generally referenced 10, includes a substrate 12 upon which is deposited a superconducting thin film 15. The substrate may be formed of either a conductive or non conductive material. As noted above a mica sheet that is overcoated with NaCl has been found to work well in practice. The thin film is preferably formed of chromium or a chromium alloy that is deposited upon the substrate to a thickness such that the film exhibits a strong negative susceptibility and thus acts as a superconductor at room temperatures. A protective coating 17 is next placed over the thin film to protect the film from harmful atmospheres and prevent it from oxidizing. If the film is oxidized it will lose its superconductivity. The protective coating may be formed of a transition element or a noble metal. Both palladium and silver coating will provide good protection for the thin film and tests have shown that these materials actually enhance the superconductivity of the thin film by making its susceptibility more negative.

Alternatively, the protective coating may be replaced by an inert atmosphere in which the superconductor operates. The superconducting device 10 in FIG. 3 is shown in a flat configuration. It should be clear that it can be formed in any suitable configuration that might be required to make the device compatible with other devices such as a computer circuit 22. For example, the substrate may be a cylindrical core with a thin film and a protective coating surrounding the core to form a transmission line of any suitable length.

A pair of terminals 18-19 are wire bonded to the device in electric contact with the thin chromium film. The terminals are connected by leads 20-20 to a voltage source or power supply 21 for producing a current flow through the thin film superconductor.

FIG. 4 illustrates a second embodiment of the present invention wherein multiple double layered units 32-32 each containing a chromium or chromium alloy thin film 33 and protective overcoating 34 are placed one over the other upon a substrate 31 to create a sandwich like structure. Here again the thickness of the thin chromium based film is controlled so that the film is superconducting. Accordingly, each thin film acts as a separate superconductor with the films combining to increase the current or signal carrying capacity of the device. Any number of layers may be placed over the substrate to meet the demands of the network being serviced. In this second embodiment of the invention, an electromagnet 35 containing a pair of pole pieces 36 and 37 is used to induce a current flow in the multilayered structure.

Figure 5:
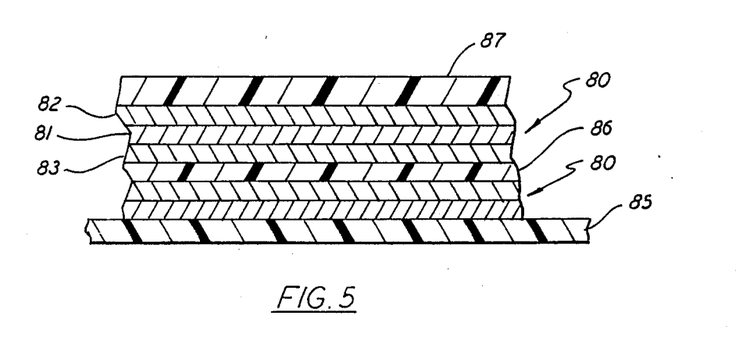
FIG. 5 is another enlarged view in section of a further embodiment of the invention.

FIG. 5 illustrates another embodiment of the invention which also includes multiple layered units 80-80 each containing a superconducting chromium thin film 81, a protective overcoating and a protective undercoating 83. The layered units are mounted on a glass or mica substrate 85 and are each separated by a nonconductive strip 86 which electrically isolates one unit from the other. This type of isolation may be needed in certain high frequency signal transmission applications and in certain applications acts as a control in the system to regulate the flow of current between superconducting films. An outer shield 87 of plastic is shown wrapped about the entire assembly to physically protect the assembly from external forces.

Another example of the invention is shown in FIG. 6. It consists of an n-type semiconductor 89, with two p-type sections 90 and 91. These p-type sections are in contact with chromium thin films 92, 93 an 95. The geometry of these thin films are as described above so that the films have a negative susceptibility and thus are capable of operating as superconductors. Superconductors 93, 95 which may be input and output devices, are supported by insulating films 92 and 96, and are protected against corrosion by films 97 and 99, respectively. These protective films can be metals like palladium, or they can be insulators. At least two of the p-type sections are joined by an electrical connector formed of a thin chromium film 94 and a protective coating 98. Here again the thin film geometry is such as to provide the connector with superconducting properties and the coating acts to prevent the thin film from corroding or oxidizing.

While this invention has been explained with reference to the structure disclosed herein, it is not confined to the details set forth and this application is intended to cover any modifications and changes as may come within the scope of the following claims.

What is claimed is:

1. A superconducting device that includes a substrate, a thin metallic film that has a negative susceptibility at room temperature that is mounted upon the substrate, and means to prevent the thin film from oxidizing wherein said thin metallic film is former of chromium.

2. The device of claim 1 wherein the means to prevent the chromium thin film from oxidizing is an inert atmosphere.

3. The device of claim 1 wherein the means to prevent the chromium thin film from oxidizing is an outer coating placed over the thin film.

4. The device of claim 3 wherein the outer coating is formed of a material that interacts with the chromium thin film to render the susceptibility of the thin film more negative.

5. The device of claim 4 wherein the outer coating is selected from a group consisting of noble metals and transition elements.

6. The device of claim 1 wherein the chromium is alloyed with at least one other element which will not adversely effect the negative susceptibility of the thin film.

7. The device of claim 6 wherein the alloying element is selected from the group consisting of noble metals and transition elements.

8. The device of claim 1 wherein the negative susceptibility of the thin film is between $-10^{-5}$ and $-\frac{1}{4}\pi$.

9. The device of claim 1 that includes further means to induce a current flow in the thin film.

10. The device of claim 9 wherein said means to induce a current flow is a current source.

11. The device of claim 9 wherein said means to induce a current flow is a magnet.

12. The device of claim 1 wherein the substrate is a cylindrical core and the thin film and the outer coating surround the core.

13. A superconductor device that includes a substrate, a plurality of multiple layered units mounted one over the other on the substrate, each unit including a thin chromium film having a negative susceptibility and an outer coating of a material that prevents the chromium from oxidizing.

14. The device Of claim 13 that further includes an insulating barrier positioned between the layered units.

15. The device of claim 13 wherein the barrier permits a controlled flow of electrons to move between the thin films.

16. The device of claim 13 that further includes an outer shield that surrounds the substrate and the units.

17. The device of claim 11 wherein the thin film chromium films have a negative susceptibility of between $-10^{-5}$ and $-\frac{1}{4}\pi$.

18. The device of claim 13 wherein at least one of the thin chromium films is alloyed with at least one other element that will keep the susceptibility of the thin chromium film negative.

19. The device of claim 18 wherein the alloying element is selected from the group consisting of noble metals and transition elements.

20. The device of claim 13 wherein the outer coating of each unit is palladium.

21. The device of claim 13 wherein the outer coating of each unit is silver.

22. The device of claim 13 that further includes means to induce a current flow in at least one thin film.

23. A superconducting device that includes a semiconductor having p-type and n-type sections, at least one electrical terminal in contact with one of the sections that includes an insulating layer mounted upon the surface of the semi-conductor, a thin chromium film having negative susceptibility mounted upon the insulating layer, and a protective coating placed over the thin film for preventing the thin film from corroding.

24. The device of claim 23 wherein at least two similar type sections are connected by a thin chromium film having negative susceptibility and said thin film connection having a protective coating thereover to prevent the thin film connection from corroding.

25. The device of claim 34 wherein the protective coating is formed of palladium.

26. The device of claim 34 wherein the protective coating is formed of an insulating material.

* * * * *